United States Patent
Li et al.

(10) Patent No.: US 6,665,219 B2
(45) Date of Patent: Dec. 16, 2003

(54) METHOD OF REDUCING STANDBY CURRENT DURING POWER DOWN MODE

(75) Inventors: Wen Li, Boise, ID (US); Mark R. Thomann, Boise, ID (US); Daniel R. Loughmiller, Boise, ID (US); Scott Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/199,130

(22) Filed: Jul. 22, 2002

(65) Prior Publication Data

US 2002/0181299 A1 Dec. 5, 2002

Related U.S. Application Data

(63) Continuation of application No. 09/780,606, filed on Feb. 12, 2001, now Pat. No. 6,438,060.

(51) Int. Cl.⁷ .................................. G11C 7/00
(52) U.S. Cl. ................ 365/194; 365/227; 365/233; 327/156; 327/158
(58) Field of Search .................. 365/194, 227, 365/233, 230.08, 189.05; 327/156, 158, 161, 270, 276

(56) References Cited

U.S. PATENT DOCUMENTS

| | | | |
|---|---|---|---|
| 5,815,462 A | | 9/1998 | Konishi et al. |
| 5,926,053 A | * | 7/1999 | McDermott et al. ......... 327/298 |
| 5,990,730 A | * | 11/1999 | Shinozaki ..................... 327/544 |
| 6,084,802 A | | 7/2000 | Shinozaki |
| 6,125,157 A | * | 9/2000 | Donnelly et al. ............ 375/371 |
| 6,194,938 B1 | * | 2/2001 | Waldrop ...................... 327/291 |
| 6,310,822 B1 | | 10/2001 | Shen |
| 6,437,619 B2 | * | 8/2002 | Okuda et al. ................ 327/158 |
| 6,438,060 B1 | * | 8/2002 | Li et al. ...................... 365/227 |

* cited by examiner

Primary Examiner—David Nelms
Assistant Examiner—Gene N. Auduong
(74) Attorney, Agent, or Firm—Dickstein Shapiro Morin & Oshinsky LLP

(57) ABSTRACT

An apparatus and method for reducing the power consumption of a memory integrated circuit during a period of power down mode operation by interrupting the clocking transitions of a delay line. A memory integrated circuit may include a delay lock loop including a plurality of delay elements connected to one another in series and adapted to delay propagation of the signal of a free running clock. When the delayed signal is not required, as during a period of power down mode operation, the free running clock signal is prevented from reaching the delay lock loop. Consequently the delay elements do not toggle, and power associated with delay element toggling is saved.

10 Claims, 4 Drawing Sheets

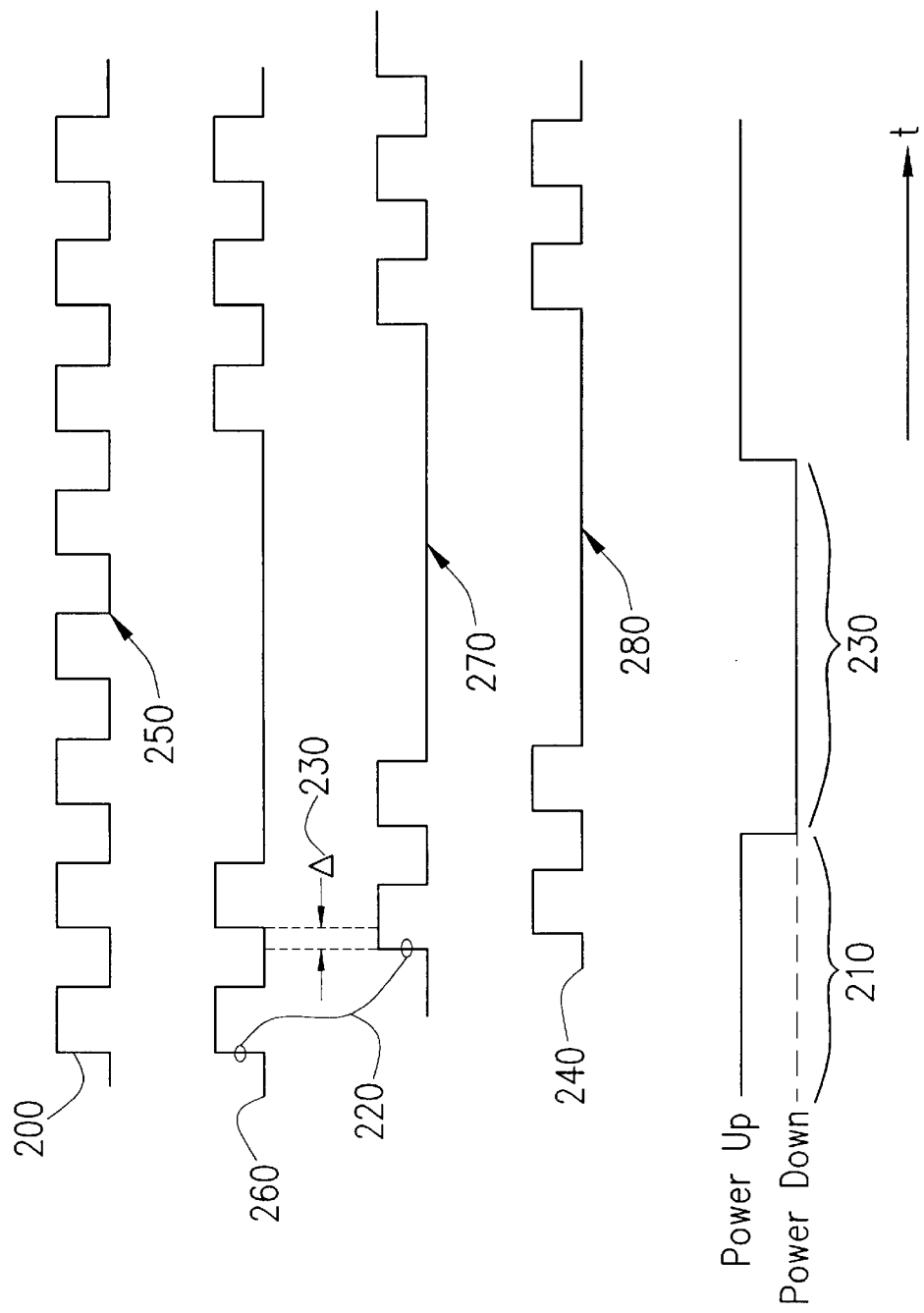

METHOD OF REDUCING STANDBY CURRENT DURING POWER DOWN MODE

CROSS REFERENCE TO RELATED APPLICATIONS

The present Application is a continuation of application Ser. No. 09/780,606, filed Feb. 12, 2001 (Issued as U.S. Pat. No. 6,438,060 on Aug. 20, 2002), the disclosure of which is herewith incorporated in its entirety.

BACKGROUND OF THE INVENTION

1. Field of the Invention

The present invention relates to a memory integrated circuit, and more specifically to a method and apparatus for reducing power consumption by a memory integrated circuit.

2. Description of the Related Art

In a double data rate (DDR) random access memory (RAM), it is desirable to have output data retrieved from memory and placed on an output bus synchronously with an external clock. Conventionally, this is achieved by including a data buffer, referred to as a DQ buffer, among the functional circuitry of the integrated circuit. The DQ buffer includes a set of latches having respective data inputs attached to an internal data bus, a set of respective data outputs attached to an external data bus, and one or more clock inputs. In response to a signal transition at the clock input of a data latch, the latch loads data available at the data input of the latch and makes it available at the latch data output, in effect transferring data from the internal data bus to the external data bus.

Also conventional is the use of a signal delay device, such as a delay locked loop (DLL) circuit timed by a free running external clock. The delay locked loop produces a plurality of delayed clock signals corresponding to, but lagging in phase, the free running external clock. Each data latch receives a delayed DLL clock signal produced by the delay locked loop to clock the clock input of the latch.

The delay locked loop includes a delay line. The delayed DLL clock signals of the delay locked loop are produced by passing the external clock signal through this delay line. The delay line consists primarily of a group of delay elements connected in series such that the output of a first delay element is operatively connected to the input of a second delay element and the output of the second delay element and is operatively connected to the input of a third delay element and so on. Typically a delay element includes at least one logic gate. Each of the of delay elements has a characteristic delay such that a signal introduced at its input produces a signal at its output after a period of time equal to the characteristic delay. Accordingly, by placing a number of delay elements in series and feeding a digital signal sequentially through the series of delay elements a delay of finite duration may be introduced into the propagation of the signal. When a signal transition is applied at the input of the DLL, each of the series of delay elements undergoes a state transition after a delay related to the number of preceding delay elements in the series. It is thus apparent that the delay is cumulative with the number of elements that must transition, and the result is a signal delay proportional to the number of delay elements in the delay line. In a delay locked loop circuit, this number of delay elements can be varied to insure that the delay produced corresponds to the period of the external clock, less a small time allowed for signal transmission of a clock signal from the DLL to a latch of the DQ buffer.

It is a general characteristic of transistors, and hence of electronic gates and delay elements constructed with transistors, that state transitions cause a dissipation of energy. Accordingly, in making the state transitions described above, the delay elements of a DLL dissipate a certain amount of power.

Because, there is a relatively large number of delay elements in a delay line, and because each of these elements must transition, or toggle, with each transition of the external clock, the DLL circuit represents a locus of some power dissipation in a DRAM integrated circuit, particularly in a double data rate (DDR) DRAM. Generally, this power loss is tolerable, and is necessary for functioning of the chip. Nonetheless, saving all, or a portion, of the energy dissipated in toggling of the delay elements of the DLL would be advantageous.

SUMMARY OF THE INVENTION

The present invention reduces the power consumption of an integrated circuit by eliminating unnecessary cycling of a delay locked loop circuit during a power down mode of operation of a DRAM. Power down mode is a mode of operation during which system power is conserved. In a preferred embodiment, when the integrated circuit is placed in a power down mode, the integrated circuit of the invention interrupts transmission of a free running external clock signal that is otherwise received by an input of the delay locked loop. Because the delay locked loop does not receive the external clock signal, the delay elements of the delay line of the delay locked loop do not toggle. Rather, the delay elements of the delay line remain in a constant state as long as the integrated circuit continues to receive power and the delay locked loop does not receive the clock signal. Since operation of electronic logic gates in a constant state requires less power than operation of the same gates in transition, a power savings is realized.

In one aspect of the invention, the integrated circuit is manufactured with a switch. The switch is most commonly a circuit, made of gates, implemented with transistors. The switch circuit is electrically connected in series with a conductive line that connects the external clock to the external clock input of the delay locked loop. The switch circuit can be switched to be non-conductive during power down. When the switch is nonconductive, transmission of the external clock signal is interrupted by the switch circuit, and the delay locked loop does not receive the external clock signal.

Accordingly, the invention includes a method of reducing the power consumption of a random access memory integrated circuit by preventing a delay locked loop, or other internal clock producing circuit, from receiving an external clock signal during a power down mode. In another aspect, the invention includes an embodiment of a memory integrated circuit including a switch, e.g. a transistor based gate circuit, electrically connected in series with a conductive trace adapted to operatively connect an external clock with an external clock input of a delay locked loop or other internal clock producing circuit.

In various other aspects, the invention includes methods and embodiments adapted to otherwise prevent toggling of the delay line of a delay locked loop when the DLL clock signal produced by that loop is not required, as during operation in power down mode.

BRIEF DESCRIPTION OF THE DRAWINGS

The foregoing and other advantages and features of the invention will become more apparent from the detailed description of the preferred embodiments of the invention given below with reference to the accompanying drawings in which:

FIG. 3 shows the state timing of signals indicating one aspect of operation of the present invention.

DETAILED DESCRIPTION OF THE INVENTION

Figure 1:
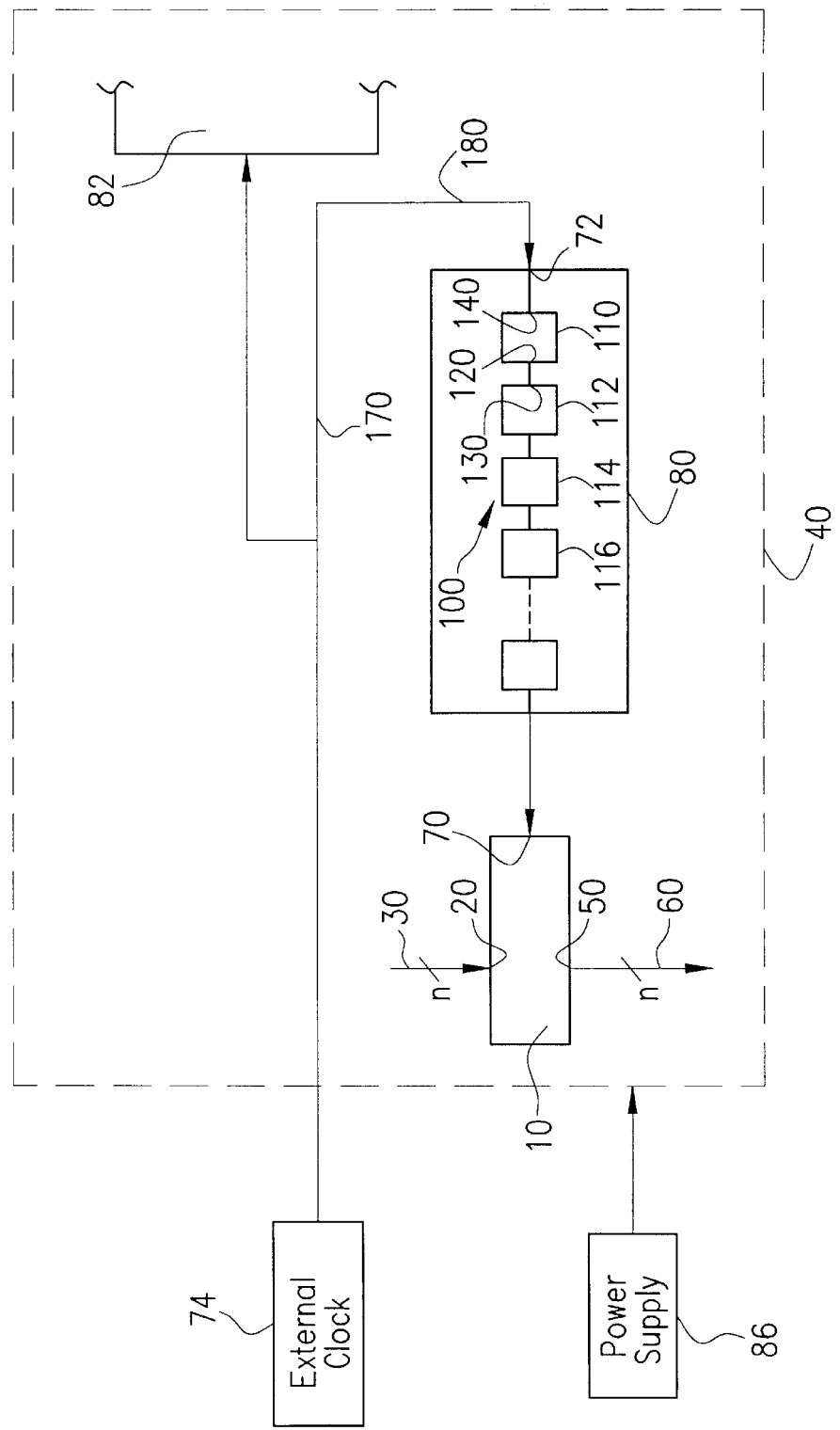
FIG. 1 shows an external clock and a portion of a conventional integrated circuit, including a delay locked loop portion, in block diagram form.

A memory device having a conventional delay locked loop circuit is illustrated in FIG. 1. The present invention will be described as set forth in the exemplary embodiments illustrated in FIGS. 2A, 2B and 3. Other embodiments may be utilized and structural or logical changes may be made without departing from the spirit or scope of the present invention. Like items are referred to by like reference numerals throughout the drawings.

FIG. 1 illustrates a portion of a conventional memory device circuit. As shown, a DQ buffer 10 formed as a plurality of latches has a plurality n of data inputs 20 connected to a first multi-bit internal data path 30 of a RAM integrated circuit 40. As also shown, n data outputs 50 of the DQ buffer are connected to a second external data path 60, for example a bus external to the illustrated memory device. The DQ buffer 10 also includes a delay locked loop (DLL) clock input 70 that, when triggered, causes a latching of data and thus transfer of data across the DQ buffer from the data input paths 30 to the data output paths 60. A RAM integrated circuit 40 also includes a delay locked loop (DLL) 80 with an input 72 adapted to receive a signal from a substantially periodic external clock 74. Generally, the external clock 74 is a free running clock which is received from a memory controller or other external circuit. The DLL circuit 80 provides a signal to the DLL clock input 70 of the DQ buffer 10 at precisely the correct time to insure the latching of output data in a particular relationship with the timing of external clock 74. To this end, the DLL circuit 80 delays the passage of an external clock signal by a time almost equal to one fill period of the external clock signal. Accordingly, a clock transition of the external clock signal simultaneously initiates activity in a memory logic array 82 of the RAM integrated circuit 40, and also begins propagating through the DLL circuit 80.

The DLL circuit 80 includes a delay line 100. The delay line incorporates a plurality of delay elements 110, 112, 114, 116, for example, connected in series such that an output 120 of one delay element is connected to an input 130 of the next delay element in the series. The external clock input 72 of the delay line is operatively connected to an input 140 of the first delay element in the series. As previously described, an external clock 74 supplies a clock signal to the input 72 of the DLL circuit 80. A power supply 86 supplies power to the system. The external clock signal is applied to the input 140 of the first delay element 110 of the delay line 100. The first delay element 110 undergoes a state transition in response to the signal transition applied at its input 140, and changes the state of its output 120 accordingly. During the state transition, the power dissipated by the delay element 110 increases for a finite time. As noted above, the output 120 of the first delay element 110 is operatively connected to an input 130 of a second delay element 112 so that when the output 120 of the first delay element changes state, the input 130 of the second delay element 112 detects this change, and the second delay element 112 also changes state. Consequently the second delay element, like the first, experiences an increase in power dissipation for a finite time.

Generally a delay line 100 includes many delay elements, each of which experiences a state transition in response to a clock transition at DLL input 72. It should be noted that the number of delay elements in the delay line 100 may be large, and may in fact vary automatically according to the requirements of the system and the frequency of the external clock 74. The combination of a free running clock operating at high frequency, and a large number of delay elements, means that a significant amount of power, taken in the context of the integrated circuit, may be dissipated in state transitions of the delay elements. As mentioned previously, it is unnecessary for the DQ buffer to transfer data from its data input 20 to its data output 50 during a power down mode. Consequently the DLL circuit need not operate when the system is in power down mode. Since not operating the DLL circuit means that the delay elements of the delay line 100 need not transition, the power associated with such transitions may be saved by not operating the delay line during power down mode.

Figure 2A:
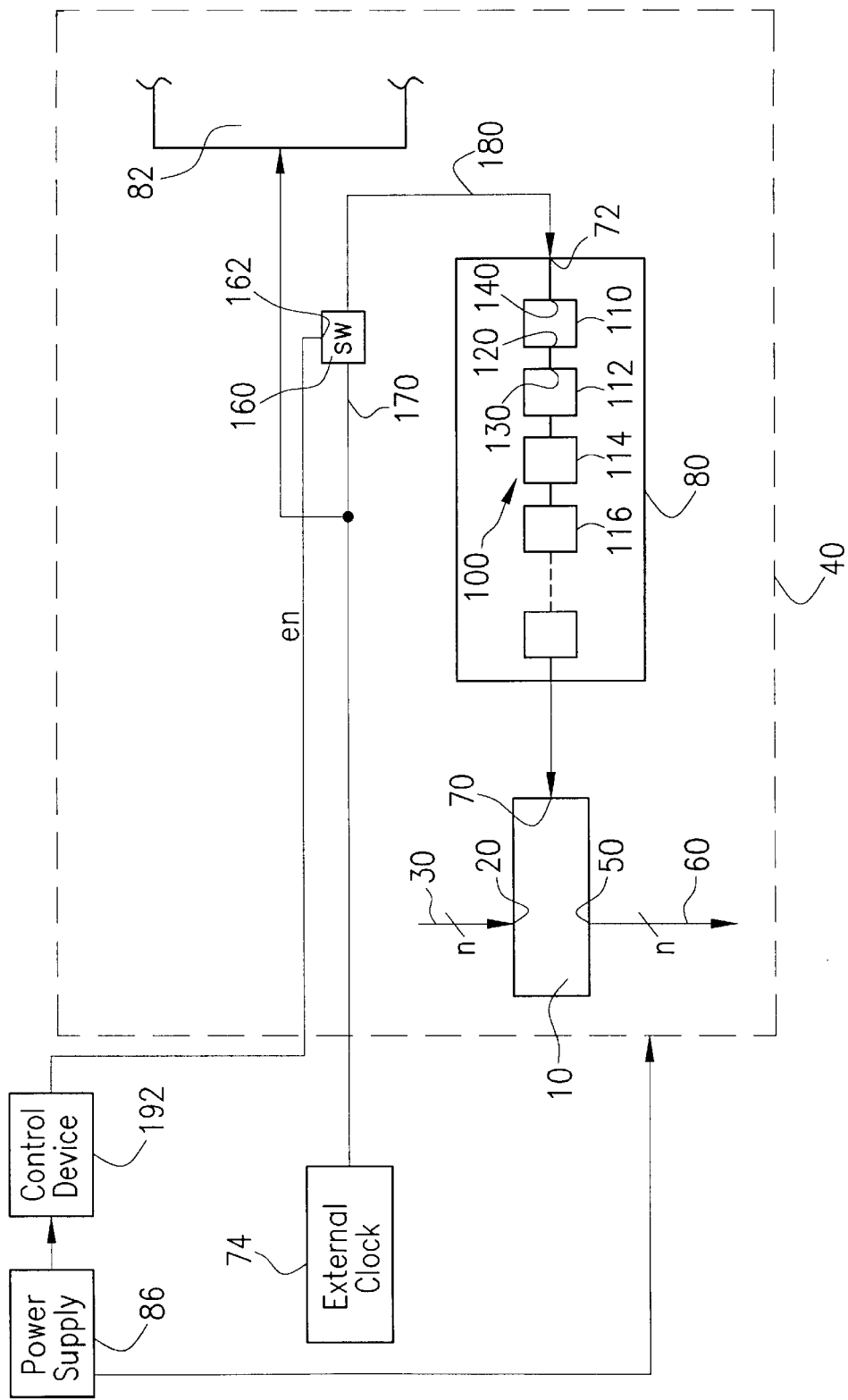
FIG. 2A shows a portion of the integrated circuit of the present invention, along with an external clock and a control device, in block diagram form.

It is thus a feature of the present invention that the DLL circuit 80 is disabled during a power down mode. According to one embodiment of the invention, as shown in FIG. 2A, this is achieved by disposing a switch circuit 160, or other switch, having a control input 162 designated enable (en). The switch is in series with conductive traces 170, 180 that conduct the external clock signal from an external clock 74 to the input 72 of the DLL circuit 80. In a first state this switch 160 is closed, or conductive, and conducts the external clock signal through to the DLL input 72. In a second state, operative during power down mode, this switch 160 is open or non-conductive, and prevents the external clock signal from reaching the DLL input 72. As a result, when the switch 160 is open, no external clock signal is received by the input 72 of the DLL circuit 80, and no state transitions take place within the delay elements of the delay line 100 of the DLL.

As a practical matter, the implementation of such a switch may reduce the current requirements of a RAM integrated circuit during power down mode by from about 1 to about 15 milliamps, or more.

Figure 2B:
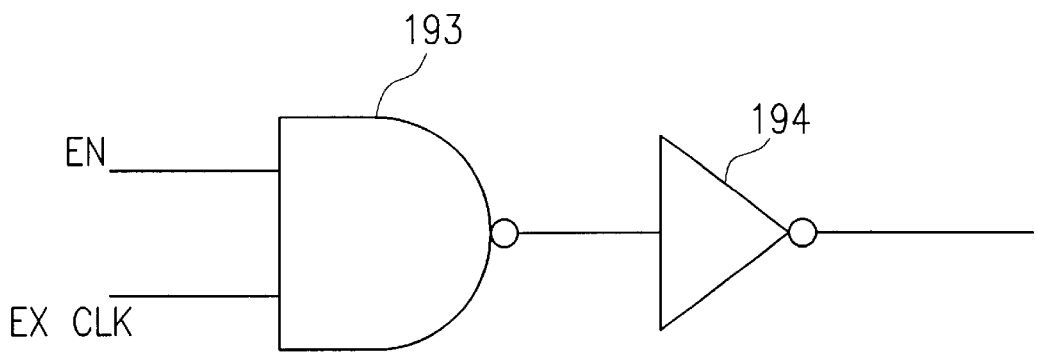
FIG. 2B shows two alternative embodiments of the switch of the present invention implemented using logic gates.
Figure 2B:
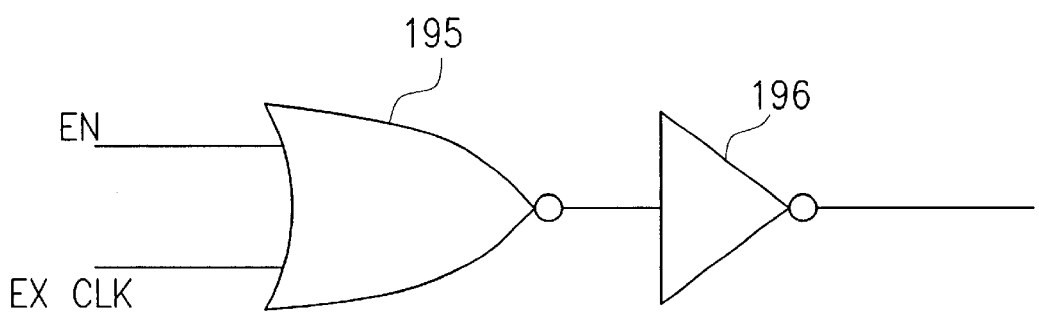

As will be apparent to one of skill of the art, the switch 160 may be implemented as any of a variety of circuits, such as, for example, a gate circuit including insulated gate field effect transistors. FIG. 2B illustrates two alternative embodiments of a logic-gate based circuit adapted to serve as a switch 160. In a first circuit, a Nand gate 193 is connected in series with a Not gate 194. In a second circuit, a Nor gate 195 is connected in series with a Not gate 196. The Nand and Nor gates each have a first input serving as an external clock input, and a second input serving as an enable or control input. In both embodiments of the circuit, the output of the Not gate, 197, 198, serves as an output of the switch circuit.

The use of the gates shown in FIG. 2B is merely exemplary, and one of skill of the art will readily ascertain that another switching device, such as a microfabricated relay or a mechanical switch, would also serve. In alternative embodiments, switching devices could be incorporated within the delay line 110, or elsewhere within the DLL circuit 80. Such switches might be external to, or part of, the delay elements 110, 112, 114, 116 of the delay line 110. Accordingly it should be understood that many different types of switches or methods might be used to prevent cycling of the delay line during power down mode.

As shown in FIG. 2A, a control device 192 may be provided which is operatively connected to a control (enable) input 162 of the switch 160. The control device may be adapted to give a user automatic or manual control over the switch, and thereby permit a user to allow or prevent the external clock input 72 of the DLL from receiving the external clock signal generated by the external clock 74. Typically the power supply 86 of the system is operatively connected to the control device.

Operation of the invention is illustrated in FIG. 3 which shows the relative timing of state and signal transitions for an exemplary embodiment of the invention. The external clock signal 200 is shown as a free running periodic square wave. Also shown is the controlled external clock signal 260, as controlled by the switch 160 and received at the input 72 of the DLL. During a period of conventional power up operation 210 the controlled external clock signal 260, is substantially identical to the external clock signal 200. During conventional operation 210 the DLL clock signal 270 is shown to follow 220 the controlled external clock signal 260 at the DLL input 72 with a phase delay of 360 degrees, less a small delta 230. This delta represents time allowed in the design of the integrated circuit for the transmission of the DLL clock signal from the output 82 of the DLL circuit to the input 70 of the DQ buffer. Accordingly during a period of conventional operation 210 the DQ buffer transfers data 240 to its outputs.

During a period of power down mode operation 230, the external clock signal continues to transition normally 250. According to the invention, however, the controlled external clock signal 260 does not undergo any state transition. Hence the external clock input 72 of the DLL circuit does not receive any state transition 260. Consequently, the DLL circuit does not cycle, and in particular the delay elements of the DLL delay line undergo no state transitions. This is reflected in the constant value of the DLL clock output 270 resulting from power down 230. The absence of state transitions indicated by the DLL clock 270 and DQ output 280 signals during power down mode saves energy as discussed above.

While preferred embodiments of the invention have been described and illustrated above, it should be understood that these are exemplary of the invention and are not to be considered as limiting. Additions, deletions, substitutions, and other modifications can be made without detracting from the spirit or scope of the present invention. Accordingly, the invention is not to be considered as limited by the foregoing description but is only limited by the scope of the appended claims.

What is claimed as new and desired to be protected by Letters Patent of the United States is:

1. A memory integrated circuit comprising:
    a clock control circuit adapted to operate in a first power up mode and a second power down mode having:
        a signal switch device with a first signal input, a second signal output, and a third control input, said signal switch device adapted to couple and decouple said first input from said second output responsive to a control signal received by said third control input received by said third control input received at said control input; and
        a signal delay device with a fourth signal input and a fifth signal output, said fourth signal input operatively coupled to said second signal output, said signal delay device being adapted to receive a periodic clock signal during a power up time interval of said power up mode when said first input is coupled to said second output.

2. A memory integrated circuit as defined in claim 1 wherein said signal delay device comprises:
    a delay locked loop circuit.

3. A memory integrated circuit as defined in claim 1 wherein said signal switch device comprises:
    a logic gate circuit including a plurality of transistors.

4. An integrated circuit memory device comprising:
    a clock signal medium adapted to conduct a periodic clock signal from a clock signal input node to a first termination node during a first power down time interval and from said clock signal input node past said first termination node to a second termination node during a second power up time interval, said clock signal medium including a delay device between said first and second termination nodes, said delay device adapted to adjust a propagation delay of said periodic clock signal over said portion of said clock signal medium between said first and second termination nodes, said delay device dissipating a first quantity of heat during said first power down time interval and a second larger quantity of heat during said second power up time interval.

5. An integrated circuit memory device as defined in claim 4 wherein said clock signal path comprises:
    an electrical conductor; and
    a logic gate.

6. A method of dissipating a first level of power from a memory device during a power up time interval when said memory device is operating in a first operating mode and a second lower level of power from said memory device during a power down time interval when said memory device is operating in a second operating mode, the method comprising:
    receiving a periodic clock signal at an input of a delay locked loop circuit of said memory device during said power up time interval, such that a plurality of delay elements within the delay locked loop periodically alternate between first and second states during said power up time interval; and
    excluding said periodic clock signal from said input of said delay locked loop circuit of said memory device and during said power down time interval such that said plurality of delay elements remain quiescent in respective states during said power down time interval whereby a larger amount of power is dissipated by said delay locked loop during said power up time interval than during said power down time interval.

7. A method of controlling power dissipation by an integrated circuit comprising:
    applying a periodic signal to a delay element of said integrated circuit during a power up interval;
    withholding said periodic signal from said delay element during a power down interval; and
    controlling said applying and withholding by passing said periodic signal through a switching device adapted to receive a control signal, said switching device forming a conductive pathway from said input to said output in response to a power up state of said control signal and said switching device adapted to block said conductive pathway in response to a power down state of said control signal.

8. A method as defined in claim 7 said periodic signal is an electrical signal.

9. A method as defined in claim 7 wherein said control signal is an electrical signal.

10. A method of operating a memory integrated circuit comprising:
- receiving a periodic clock signal at a first input node of a switching device of said memory integrated circuit, said switching device having a second control node and a third output node;
- receiving a control signal at said control node responsive to a binary state of said control signal, alternately blocking said clock signal, and passing said clock signal from said first node to form a passed signal at said third node;
- receiving said passed signal at an input node of a delay device; and
- dissipating an additional incremental amount of energy from said delay device while receiving said passed signal, said incremental amount of energy dissipated in addition to an amount of energy dissipated when said delay device is not receiving said passed signal.

* * * * *